(12) United States Patent
Michikoshi

(10) Patent No.: US 11,715,767 B2
(45) Date of Patent: Aug. 1, 2023

(54) SILICON CARBIDE SEMICONDUCTOR DEVICE

(71) Applicant: SUMITOMO ELECTRIC INDUSTRIES, LTD., Osaka (JP)

(72) Inventor: Hisato Michikoshi, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 201 days.

(21) Appl. No.: 17/311,000

(22) PCT Filed: Mar. 3, 2020

(86) PCT No.: PCT/JP2020/008952
§ 371 (c)(1),
(2) Date: Sep. 3, 2021

(87) PCT Pub. No.: WO2020/184304
PCT Pub. Date: Sep. 17, 2020

(65) Prior Publication Data
US 2022/0165851 A1  May 26, 2022

(30) Foreign Application Priority Data
Mar. 12, 2019 (JP) .................. 2019-045171

(51) Int. Cl.
*H01L 29/16* (2006.01)
*H01L 23/00* (2006.01)

(52) U.S. Cl.
CPC ......... *H01L 29/1608* (2013.01); *H01L 24/45* (2013.01); *H01L 2224/48247* (2013.01)

(58) Field of Classification Search
CPC ............. H01L 29/1608; H01L 24/45; H01L 2224/48247; H01L 29/7802; H01L 23/3735; H01L 23/49531; H01L 23/49562; H01L 24/05; H01L 24/06; H01L 24/33; H01L 24/48; H01L 24/49; H01L 24/73; H01L 24/29; H01L 24/32; H01L 24/83;
(Continued)

(56) References Cited

U.S. PATENT DOCUMENTS

| | | |
|---|---|---|
| 2006/0138532 A1 | 6/2006 | Okamoto et al. |
| 2013/0092948 A1 | 4/2013 | Otsuka |
| 2013/0168845 A1 | 7/2013 | Aoshima |

FOREIGN PATENT DOCUMENTS

| | | |
|---|---|---|
| JP | 2005-129886 | 5/2005 |
| JP | 2006-179735 | 7/2006 |

(Continued)

*Primary Examiner* — Robert G Bachner
(74) *Attorney, Agent, or Firm* — IPUSA, PLLC

(57) ABSTRACT

A silicon carbide semiconductor device includes a metal plate having a first main surface and a second main surface, the second main surface being opposite to the first main surface, an insulating film provided on a portion of the first main surface of the metal plate, a first conductive layer provided on the insulating film, and a silicon carbide semiconductor chip. The silicon carbide semiconductor chip includes a first electrode and a second electrode on a first surface and a third electrode on a second surface, the second surface being opposite to the first surface. The first surface of the silicon carbide semiconductor chip faces the first main surface of the metal plate, the first electrode is bonded to the first conductive layer with a first bonding material, and the second electrode is bonded to the first main surface of the metal plate with a second bonding material.

12 Claims, 13 Drawing Sheets

(58) Field of Classification Search
CPC .......... H01L 24/92; H01L 29/7395; H01L 2224/04026; H01L 2224/04042; H01L 2224/05647; H01L 2224/29347; H01L 2224/0603; H01L 2224/06181; H01L 2224/29111; H01L 2224/29339; H01L 2224/32245; H01L 2224/33181; H01L 2224/48472; H01L 2224/48491; H01L 2224/73265; H01L 2224/83801; H01L 2224/8384; H01L 2224/92247; H01L 2924/00014; H01L 2924/10272; H01L 2924/19107; H01L 23/34; H01L 23/48; H01L 29/78
See application file for complete search history.

(56) References Cited

FOREIGN PATENT DOCUMENTS

| | | |
|---|---|---|
| JP | 2012-028674 | 2/2012 |
| JP | 2013-089948 | 5/2013 |
| JP | 2017-034161 | 2/2017 |
| WO | 2013/061392 | 5/2013 |

SILICON CARBIDE SEMICONDUCTOR DEVICE

TECHNICAL FIELD

The present disclosure relates to a silicon carbide semiconductor device.

The present application is based on and claims priority to Japanese Patent Application No. 2019-045171, filed on Mar. 12, 2019, the entire contents of which are incorporated herein by reference.

BACKGROUND ART

Silicon carbide semiconductor devices, such as metal-oxide-semiconductor field-effect transistors (MOSFETs), are usually hardened with mold resin or the like, in a state in which a semiconductor chip is coupled to an electrode terminal. As materials used for semiconductor chips, silicon is common, but in order to improve withstand voltage, there is a vertical transistor that uses silicon carbide (SiC), which has a wider band gap than silicon (Si), and that has a structure in which the current flows in the thickness direction.

PRIOR ART DOCUMENT

Patent Document

[Patent Document 1] Japanese Laid-open Patent Publication No. 2005-129886
[Patent Document 2] Japanese Laid-open Patent Publication No. 2012-028674

SUMMARY OF THE INVENTION

A silicon carbide semiconductor device according to the present disclosure includes a metal plate having a first main surface and a second main surface, the second main surface being opposite to the first main surface, an insulating film provided on a portion of the first main surface of the metal plate, a first conductive layer provided on the insulating film, and a first electrode and a second electrode on a first surface. Additionally, the silicon carbide semiconductor device includes a silicon carbide semiconductor chip that includes a third electrode on a second surface opposite to the first surface. The first surface of the silicon carbide semiconductor chip faces the first main surface of the metal plate, the first electrode is bonded to the first conductive layer with a first bonding material, and the second electrode is bonded to the first main surface of the metal plate by a second bonding material.

EMBODIMENT FOR CARRYING OUT THE INVENTION

Figure 1:
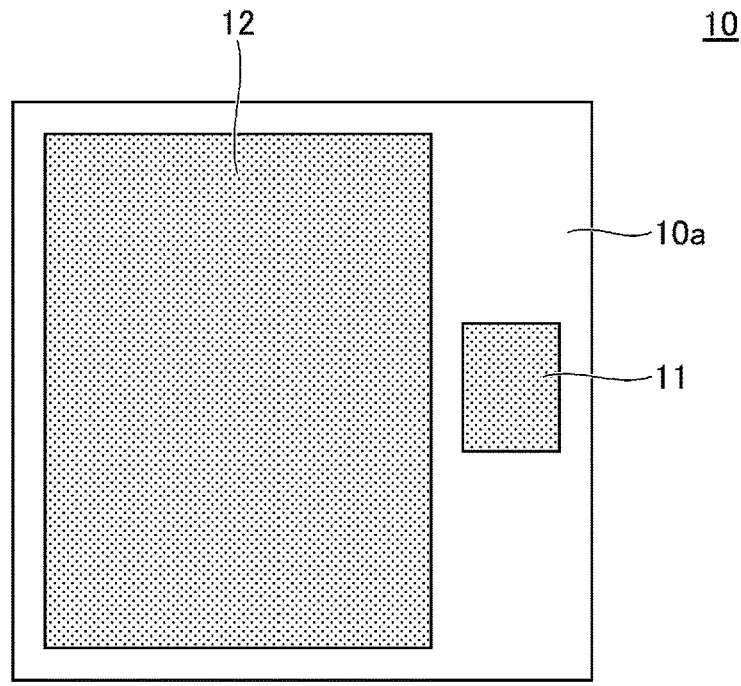
FIG. 1 is a plan view of a first surface of a semiconductor chip.
Figure 2:
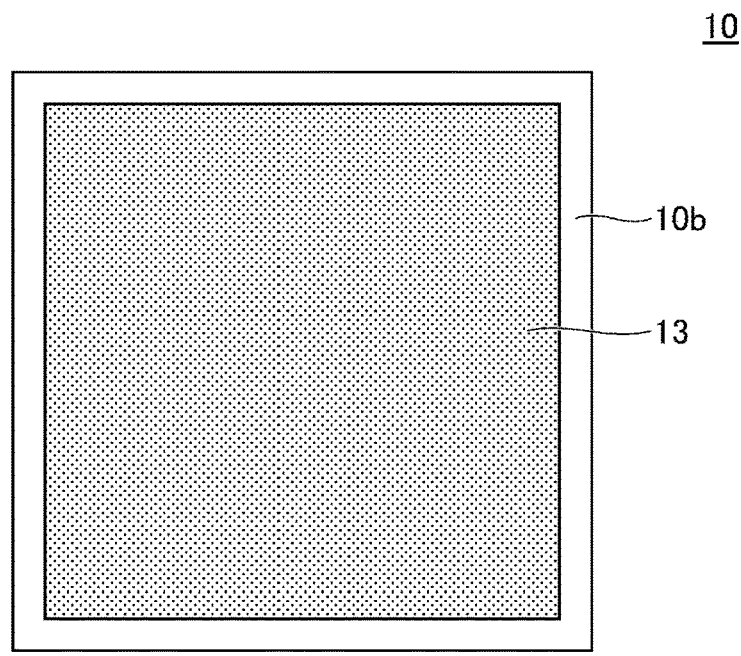
FIG. 2 is a plan view of a second surface of the semiconductor chip.

Problem to be Solved by the Present Disclosure

By using conventional vertical SiC transistors, the withstand voltage can be improved and a large current can flow. However, when a large current flows through a semiconductor chip, heat is generated, and thus efficient heat dissipation is required.

Therefore, in vertical SiC transistors, a silicon carbide semiconductor device having a structure in which heat can be efficiently dissipated is desired.

Effect of the Present Disclosure

According to the present disclosure, in vertical SiC transistors, a silicon carbide semiconductor device having a structure in which heat can be efficiently dissipated can be provided.

An embodiment will be described below.

DESCRIPTION OF EMBODIMENT OF THE PRESENT DISCLOSURE

First, aspects of the present disclosure are listed and described below. In the following description, the same or corresponding elements are referenced by the same sign and the descriptions thereof are not repeated.

[1] According to one aspect of the present disclosure, a silicon carbide semiconductor device includes a metal plate having a first main surface and a second main surface, the second main surface being opposite to the first main surface, an insulating film provided on a portion of the first main surface of the metal plate, a first conductive layer provided on the insulating film, and a silicon carbide semiconductor chip that includes a first electrode and a second electrode on a first surface and a third electrode on a second surface, the second surface being opposite to the first surface. The first surface of the silicon carbide semiconductor chip faces the first main surface of the metal plate, the first electrode is bonded to the first conductive layer with a first bonding material, and the second electrode is bonded to the first main surface of the metal plate with a second bonding material.

A vertical transistor using silicon carbide can flow a large current. However, when a large current flows through a semiconductor chip forming the vertical transistor, heat is generated. If the heat is not efficiently dissipated, the temperature of the semiconductor chip rises and the features are degraded. In a typical vertical transistor using silicon carbide, a drain electrode of a semiconductor chip is bonded to a lead frame, and a heat sink is connected to a surface of the lead frame that is on the opposite side from the semiconductor chip through an insulating sheet. In such a structure, heat dissipation is inefficient because the thermal conductivity of the insulating sheet is extremely low and heat generated in the semiconductor chip cannot be efficiently transferred to the heat sink.

Therefore, the inventor of the present application has studied a method of efficiently transferring heat generated in a vertical transistor to a heat sink. As a result, it is found that by directly connecting a surface on which a source electrode of the semiconductor chip is formed to the lead frame, the heat sink can be connected to a surface of the lead frame on the opposite side from the semiconductor chip without providing an insulating sheet or the like. This reduces the thermal resistance between the semiconductor chip and the heat sink, efficiently transfers heat generated in the semiconductor chip to the heat sink, and allows the heat to be dissipated.

[2] A second conductive layer bonded on the third electrode of the silicon carbide semiconductor chip with a third bonding material may be provided. In this case, the electrode terminal can be connected to the second conductive layer.

[3] The first electrode may be a gate electrode, the second electrode may be a source electrode, the third electrode may be a drain electrode, the gate electrode and a gate electrode terminal may be connected by a bonding wire, the source electrode and a source electrode terminal may be connected by a bonding wire, and the drain electrode and a drain electrode terminal may be connected by a bonding wire. In this case, for example, a field effect transistor may be configured.

[4] The first electrode may be the gate electrode, the second electrode may be an emitter electrode, the third electrode may be a collector electrode, the gate electrode and the gate electrode terminal may be connected by a bonding wire, the emitter electrode and an emitter electrode terminal may be connected by a bonding wire, and the collector electrode and a collector electrode terminal may be connected by a bonding wire. In this case, for example, an insulated gate bipolar transistor (IGBT) may be configured.

[5] The first electrode may be the gate electrode, the second electrode may be the source electrode, the third electrode may be the drain electrode, the gate electrode and the gate electrode terminal may be connected by a bonding wire, the source electrode and the source electrode terminal may be connected by a bonding wire, and the second conductive layer and the drain electrode terminal may be connected by a bonding wire. In this case, for example, a field effect transistor may be configured.

[6] The first electrode may be the gate electrode, the second electrode may be the emitter electrode, the third electrode may be the collector electrode, the gate electrode and the gate electrode terminal may be connected by a bonding wire, the emitter electrode and the emitter electrode terminal may be connected by a bonding wire, and the second conductive layer and the collector electrode terminal may be connected by a bonding wire. In this case, for example, an IGBT can be configured.

[7] The thermal conductivity of the metal plate may be 10 W/m·K or greater, the linear expansion coefficient of the metal plate may be 17.0 ppm·K or less, and the volume resistivity of the metal plate may be 1 μΩ·m or less. In this case, the thermal resistance is easily reduced and separation is not easily caused.

[8] The film thickness of the insulating film may be 10 μm or greater and 40 μm or less. In this case, it is easy to reduce a level difference relative to the first main surface while maintaining the insulating property.

[9] The film thickness of the first conductive layer may be 5 μm or greater and 20 μm or less. In this case, it is easy to reduce a level difference relative to the first main surface while maintaining the conductive property.

[10] The first bonding material and the second bonding material may contain copper or silver. In this case, it is easier to reduce the thermal resistance.

[11] A heat sink may be connected to the second main surface of the metal plate. In this case, the heat dissipation property can be further improved.

[12] According to another aspect of the present disclosure, a silicon carbide semiconductor device includes a metal plate having a first main surface and a second main surface, the second main surface being opposite to the first main surface, an insulating film provided on a portion of the first main surface of the metal plate, and a first conductive layer provided on the insulating film. The silicon carbide semiconductor device further includes a silicon carbide semiconductor chip that includes a first electrode and a second electrode on a first surface and a third electrode on a second surface, the second surface being opposite to the first surface, and a second conductive layer bonded on the third electrode of the silicon carbide semiconductor chip with a third bonding material. The first surface of the silicon carbide semiconductor chip faces the first main surface of the metal plate, the first electrode is bonded to the first conductive layer with a first bonding material, and the second electrode is bonded to the first main surface of the metal plate with a second bonding material. The thermal conductivity of the metal plate is 10 W/m·K or greater, the linear expansion coefficient of the metal plate is 17.0 ppm/K or less, and the volume resistivity of the metal plate is 1 μΩ·m or less. The film thickness of the insulating film is 10 μm or greater and 40 μm or less, and the film thickness of the first conductive layer is 5 μm or greater and 20 μm or less. The first bonding material and the second bonding material contain copper or silver.

Details of Embodiments of the Present Disclosure

In the following, an embodiment of the present disclosure (hereinafter referred to as "the present embodiment") will be described in detail, but the present embodiment is not limited thereto. Also, the length, the size, and the like in the drawings may differ from the actual one, for convenience of illustration.

A semiconductor chip used in the present embodiment has a structure in which a vertical transistor is formed in a SiC substrate. Specifically, as illustrated in FIG. 1, a gate electrode 11 and a source electrode 12 are formed on a first surface 10a that is one surface of a silicon carbide semiconductor chip 10, and a drain electrode 13 is formed on a second surface 10b that is the other surface opposite to the first surface 10a. In the present application, the gate electrode 11 may be referred to as a first electrode, the source electrode 12 may be referred to as a second electrode, and the drain electrode 13 may be referred to as a third electrode.

Next, a silicon carbide semiconductor device having a structure in which the silicon carbide semiconductor chip 10 is mounted on a metal plate that is a part of a lead frame on the drain electrode 13 side will be described with reference to FIG. 3.

Figure 3:
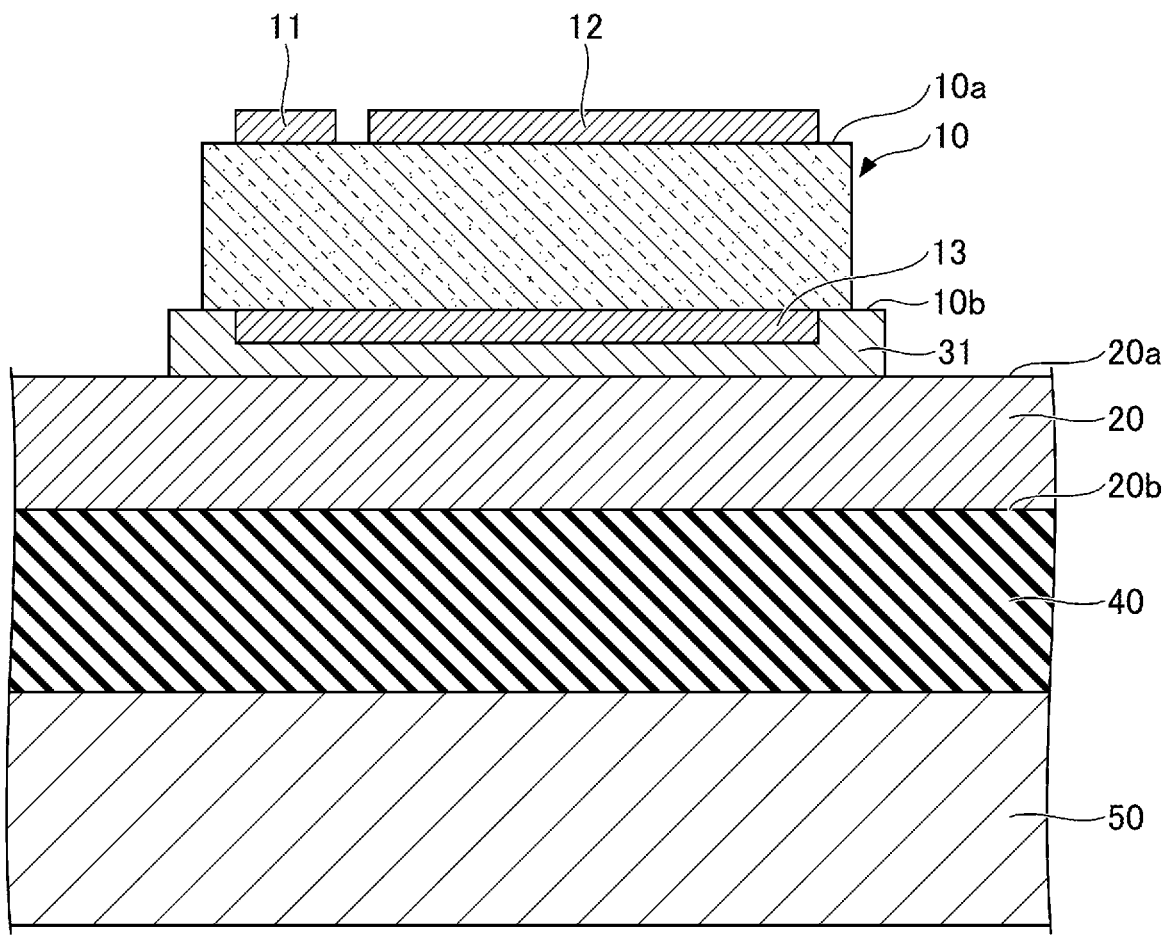
FIG. 3 is a cross-sectional view of a structure of a silicon carbide semiconductor device.

In the silicon carbide semiconductor device having the structure illustrated in FIG. 3, the drain electrode 13 of the silicon carbide semiconductor chip 10 is bonded to a first main surface 20a of a metal plate 20 with a bonding material 31 such as a Sn—Cu solder. The metal plate 20 forms part of the lead frame and the first main surface 20a is one surface of the metal plate 20. Additionally, a heat sink 50 is mounted to a second main surface 20b of the metal plate 20 through an insulating sheet 40. The second main surface 20b is the other surface of the metal plate 20 that is opposite to the first main surface 20a.

Because the silicon carbide semiconductor chip 10 is a vertical transistor of SiC, the silicon carbide semiconductor chip 10 has a high withstand voltage and a large current can flow, but when a large current flows through the silicon carbide semiconductor chip 10, heat is generated. It is not preferable that the temperature of the silicon carbide semiconductor chip 10 becomes high, because the properties of the semiconductor device vary in accordance with the temperature. Thus, as illustrated in FIG. 3, the heat sink 50 is provided on the metal plate 20 side for heat dissipation. However, because a high voltage is applied to the drain electrode 13, if a heat sink 50 formed of Al (aluminum), Cu (copper), or the like is directly connected to the metal plate 20, a high voltage is also applied to the heat sink 50. Thus, an insulating sheet 40 is provided between the second main surface 20b of the metal plate 20 and the heat sink 50, so that the heat sink 50 is insulated from the metal plate 20.

However, if the insulating sheet 40 is provided between the metal plate 20 and the heat sink 50, the insulating material forming the insulating sheet 40 prevents the efficient transfer of heat generated in the silicon carbide semiconductor chip 10 to the heat sink 50 because of extremely low thermal conductivity. That is, heat generated in the silicon carbide semiconductor chip 10 is conducted to the metal plate 20, but the thermal conduction is blocked by the insulating sheet 40 provided between the metal plate 20 and the heat sink 50 because the insulating sheet 40 has high thermal resistance. Thus, the temperature of the silicon carbide semiconductor chip 10 becomes high.

Then, it is conceivable that the thermal resistance is reduced by reducing the thickness of the insulating sheet 40. However, because the voltage applied to the drain electrode 13 is high, excessive thinning of the insulating sheet 40 may cause breakage when a high voltage is applied. Therefore, there is a limit on how much the thickness of the insulating sheet 40 can be reduced because the thickness of the insulating sheet 40 is required to be greater than a predetermined thickness.

Alternatively, it is conceivable that a heat diffusion plate having a large area is provided on the second main surface 20b of the metal plate 20 to transfer heat to the heat sink 50 through the heat diffusion plate and the insulating sheet 40. However, in this case, because it is required that the size of the insulating sheet 40 and the heat sink 50 is increased in accordance with the size of the thermal diffusion plate, the size of the silicon carbide semiconductor device is increased.

(Silicon Carbide Semiconductor Device)

Figure 4:
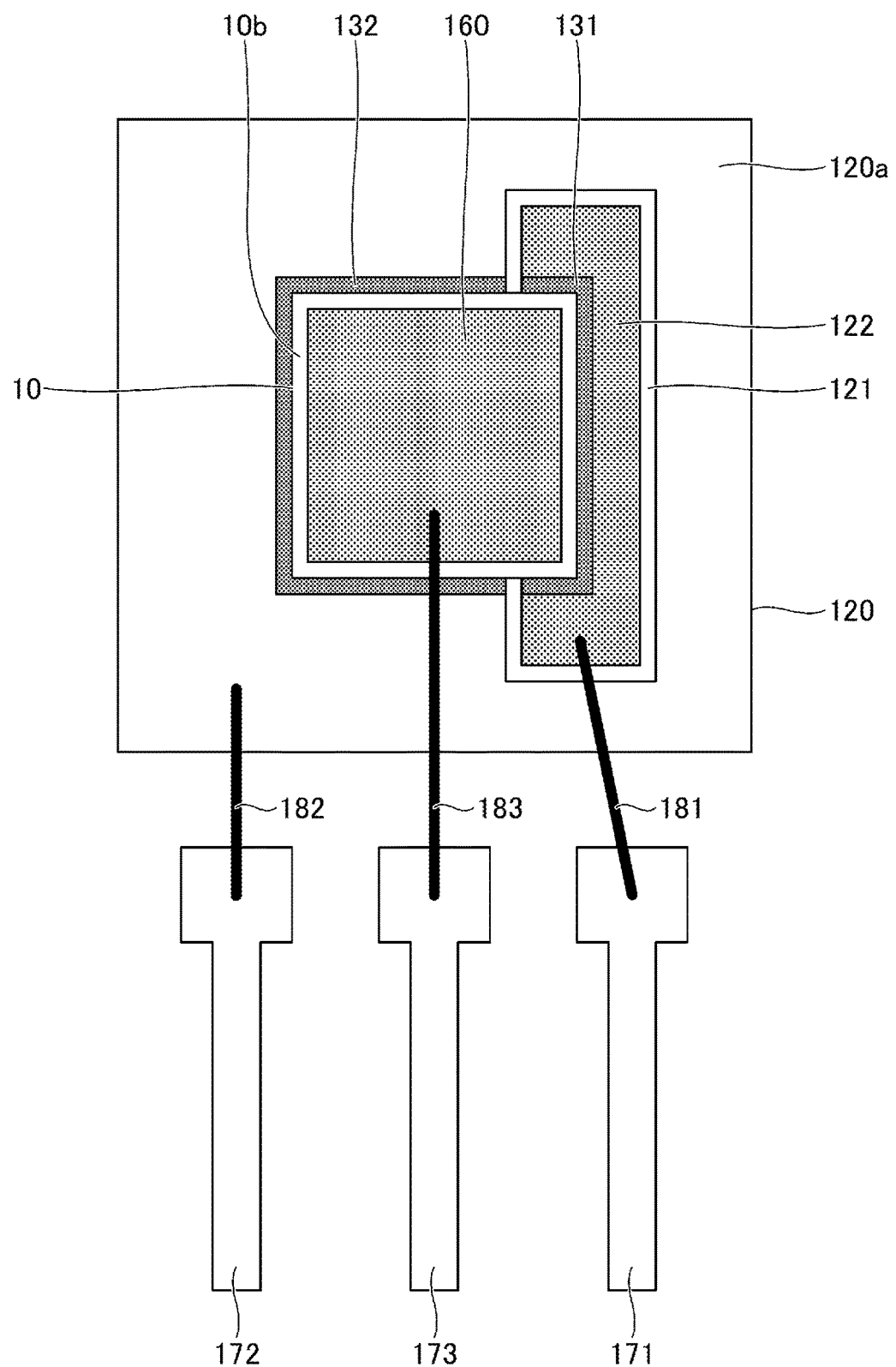
FIG. 4 is a top view of a structure of a silicon carbide semiconductor device according to an embodiment of the present disclosure.
Figure 5:
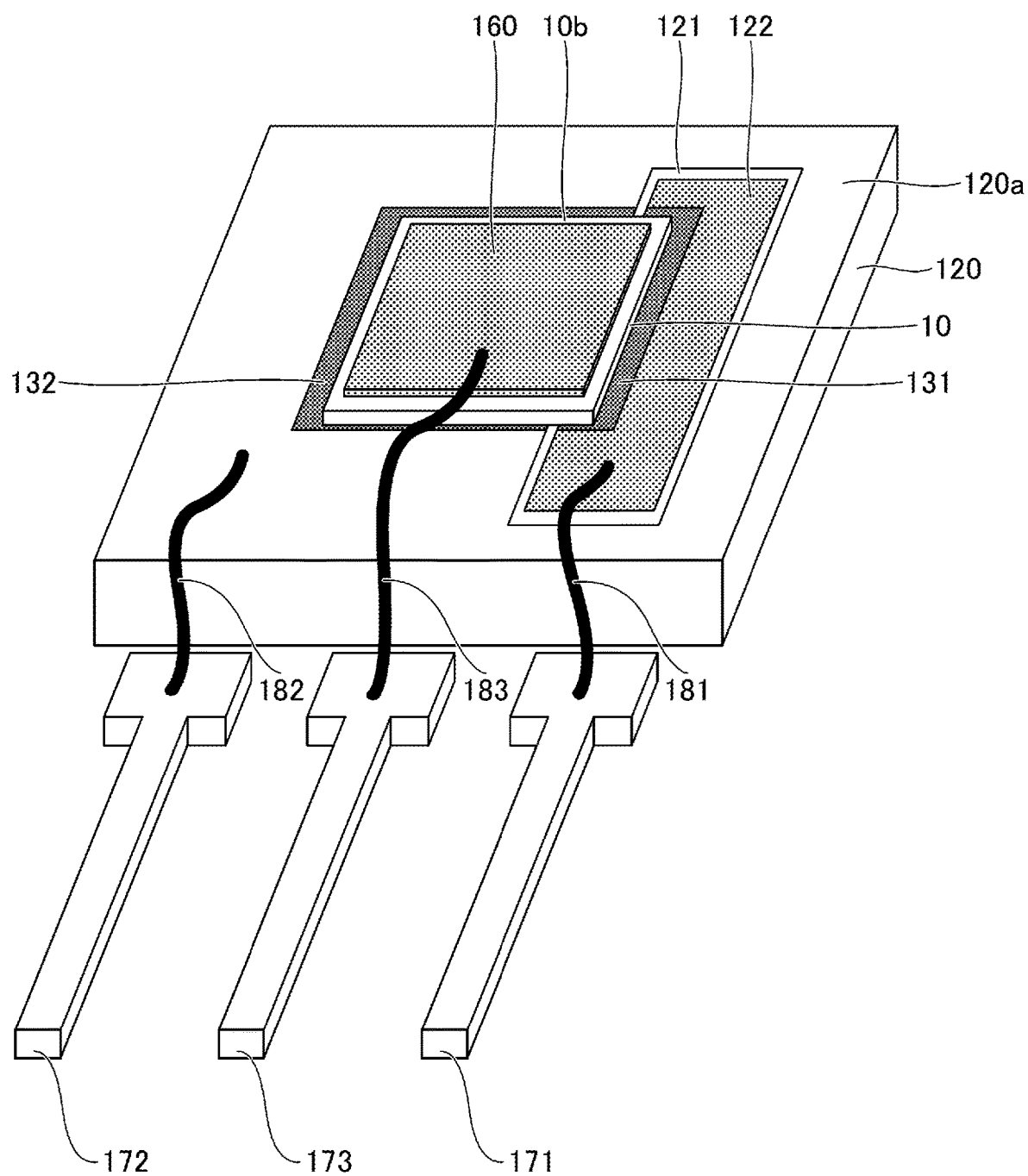
FIG. 5 is a perspective view of the structure of the silicon carbide semiconductor device according to the embodiment of the present disclosure.
Figure 6:
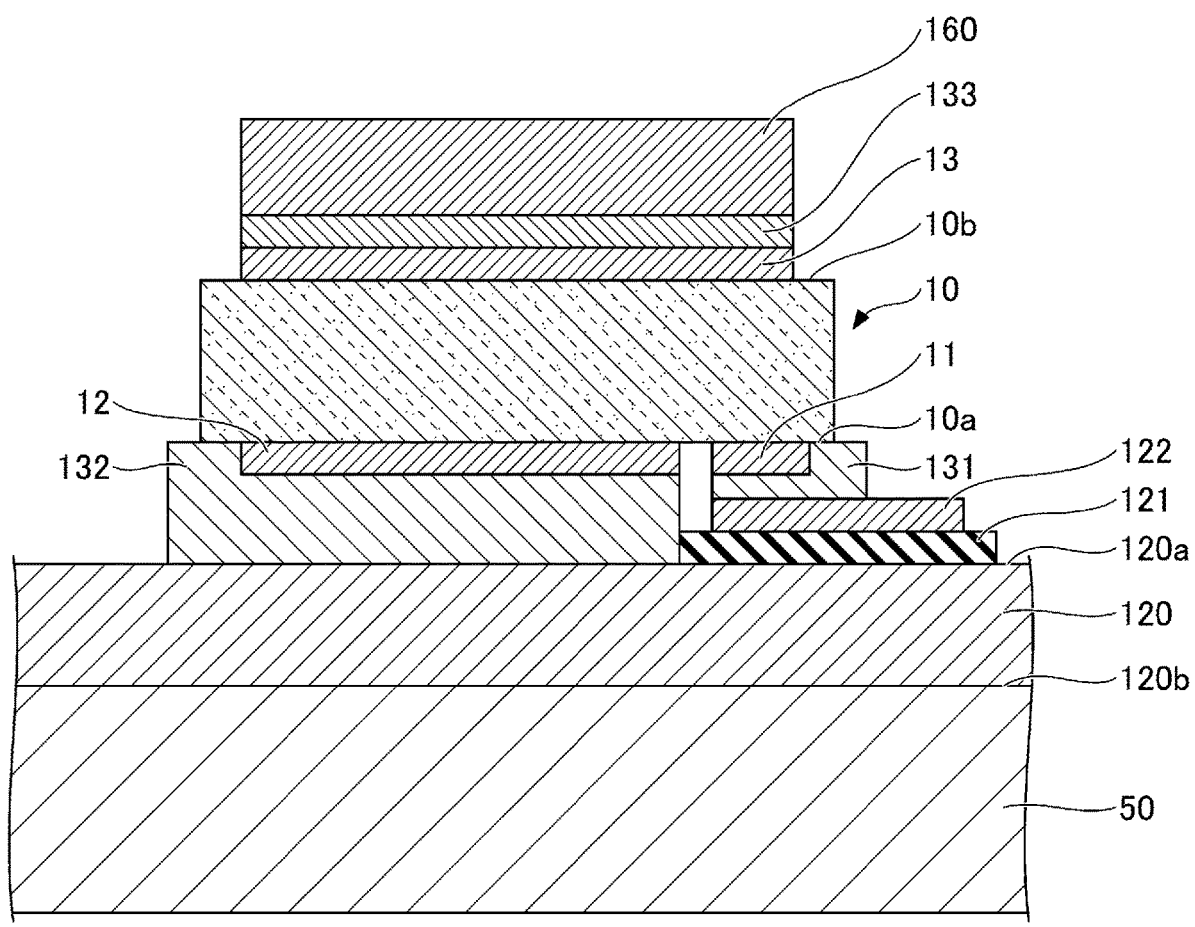
FIG. 6 is a cross-sectional view of the structure of the silicon carbide semiconductor device according to the embodiment of the present disclosure.

Next, a silicon carbide semiconductor device according to the present embodiment will be described with reference to FIGS. 4 to 6. FIG. 4 is a top view of the silicon carbide semiconductor device according to the present embodiment, FIG. 5 is a perspective view of the silicon carbide semiconductor device according to the present embodiment, and FIG. 6 is a cross-sectional view of a main part of the silicon carbide semiconductor device according to the present embodiment.

In the silicon carbide semiconductor device according to the present embodiment, the silicon carbide semiconductor chip 10 is bonded to a first main surface 120a that is one surface of a metal plate 120, on a first surface 10a side where the gate electrode 11 and the source electrode 12 of the silicon carbide semiconductor chip 10 are formed, with a bonding material. The metal plate 120 forms part of the lead frame. The heat sink 50 is connected to a second main surface 120b. The second main surface 120b is the other surface of the metal plate 120 that is opposite to the first main surface 120a of the metal plate 120. Thus, because a member that blocks thermal conduction, such as an insulating sheet, is not provided between the silicon carbide semiconductor chip 10 and the heat sink 50, heat generated in the silicon carbide semiconductor chip 10 can be efficiently conducted to the heat sink 50 through the metal plate 120.

In the present embodiment, the thermal conductivity of the metal plate 120 is preferably 10 W/m·K or greater, the linear expansion coefficient is preferably 17.0 ppm/K or less, and the volume resistivity is preferably 1 μΩ·m or less. The thermal conductivity is more preferably 150 W/m·K or greater. The linear expansion coefficient is more preferably 7.5 ppm/K or less. The volume resistivity is more preferably $5.7 \times 10^{-8}$ Ω·m or less. In order to reduce the thermal resistance between the silicon carbide semiconductor chip 10 and the heat sink 50, the thermal conductivity of the metal plate 120 is preferably high. Additionally, if the difference between the linear expansion coefficient of the metal plate 120 and the thermal expansion coefficient of SiC forming the silicon carbide semiconductor chip 10, which is 4.0 ppm/K, is large, separation or the like may occur between the metal plate 120 and the silicon carbide semiconductor chip 10. Therefore, the linear expansion coefficient of the metal plate 120 is preferably close to the thermal expansion coefficient of SiC forming the silicon carbide semiconductor chip 10, which is 4.0 ppm/K. Additionally, because the metal plate 120 is connected to the source electrode 12 of the silicon carbide semiconductor chip 10 and is a part of a source interconnect, a low resistance, that is, a low volume resistivity, is preferred.

Specifically, in the silicon carbide semiconductor device according to the present embodiment, an insulating film 121 is provided on an area of the first main surface 120a of the metal plate 120 where the gate electrode 11 of the silicon carbide semiconductor chip 10 is coupled, and a first conductive layer 122 is formed on the insulating film 121. The metal plate 120 is formed of copper, iron nickel (Fe—Ni) alloy, copper tungsten alloy (Cu—W alloy), molybdenum, a laminated material in which copper, iron nickel alloy, and copper are laminated in the thick direction, or the like, and is electrically conductive. The insulating film 121 is formed of an insulator material, such as polyimides, and the first conductive layer 122 is formed of a conductive material, such as Cu.

In the present embodiment, the first surface 10a of the silicon carbide semiconductor chip 10 and the first main surface 120a of the metal plate 120 are bonded to face each other. That is, the gate electrode 11 is bonded to the first conductive layer 122 provided on the metal plate 120 by a first bonding material 131, and the source electrode 12 of the silicon carbide semiconductor chip 10 is bonded to the first main surface 120a of the metal plate 120 by a second bonding material 132.

The drain electrode 13 of the second surface 10b of the silicon carbide semiconductor chip 10 is bonded to a second conductive layer 160 by a third bonding material 133. The second conductive layer 160 is formed of Cu or the like, and may be, for example, a metal film having a thickness of 50 μm to 100 μm or a metal plate having a thickness of about 1.5 mm. The second conductive layer 160 is provided to reduce the resistance in the in-plane direction because if the drain electrode 13 of the silicon carbide semiconductor chip 10 is thin, the resistance increases in the in-plane direction. Thus, if the drain electrode 13 of the silicon carbide semiconductor chip 10 is thick and the resistance in the in-plane direction is sufficiently low, it is not necessary to provide the second conductive layer 160 and a bonding wire 183 may be connected directly to the drain electrode 13 of the silicon carbide semiconductor chip 10. The first bonding material 131, the second bonding material 132, and the third bonding material 133 may be formed of Sn—Cu solder or the like. However, by using a sintering copper bonding material containing Cu having a high thermal conductivity or a sintering silver bonding material containing Ag (silver), the thermal resistance can be further reduced.

In the present embodiment, the first conductive layer 122 is connected to a gate electrode terminal 171 by a bonding wire 181. The first main surface 120a of the metal plate 120 is connected to a source electrode terminal 172 by a bonding wire 182. The second conductive layer 160 is connected to a drain electrode terminal 173 by a bonding wire 183.

In the silicon carbide semiconductor chip 10, the voltage applied to the source electrode 12 is relatively close to the voltage applied to the gate electrode 11 in comparison with the voltage applied to the drain electrode 13. Thus, the film thickness of the insulating film 121 famed on the first main surface 120a of the metal plate 120 can be reduced, and is preferably 10 μm or greater and 40 μm or less. The film thickness of the first conductive layer 122 is preferably 5 μm or greater and 20 μm or less. As the insulating film 121 and the first conductive layer 122 become thinner, a level difference relative to the first main surface 120a of the metal plate 120 decreases, thereby facilitating the bonding when the first surface 10a of the silicon carbide semiconductor chip 10 is bonded with the first bonding material 131 and the second bonding material 132. In contrast, if the film thickness of the insulating film 121 is too thin, the insulating property is reduced. Additionally, if the first conductive layer 122 is too thin, the conductivity decreases. Therefore, the film thickness of the insulating film 121 and the first conductive layer 122 is preferably within the above-described range.

Here, the area of the gate electrode 11 formed on the first surface 10a of the silicon carbide semiconductor chip 10 is much smaller than the area of the source electrode 12. This is because the gate electrode 11 is an electrode for control, and thus the small area of the gate electrode 11 causes no problem in terms of features, while the current flows in the source electrode 12, and thus the area of the source electrode 12 is preferably larger.

In the present embodiment, heat generated in the silicon carbide semiconductor chip 10 is conducted to the metal plate 120 through the source electrode 12 and the second bonding material 132, and is further conducted to the heat sink 50 connected to the second main surface 120b of the metal plate 120 and dissipated. Because there is no insulating sheet or the like, which blocks the thermal conduction, between the silicon carbide semiconductor chip 10 and the heat sink 50, heat can be efficiently transferred to the heat sink 50 to be dissipated.

(Method of Manufacturing Silicon Carbide Semiconductor Device)

Next, a method of manufacturing the silicon carbide semiconductor device according to the present embodiment will be described with reference to FIGS. 7 to 14.

Figure 7:
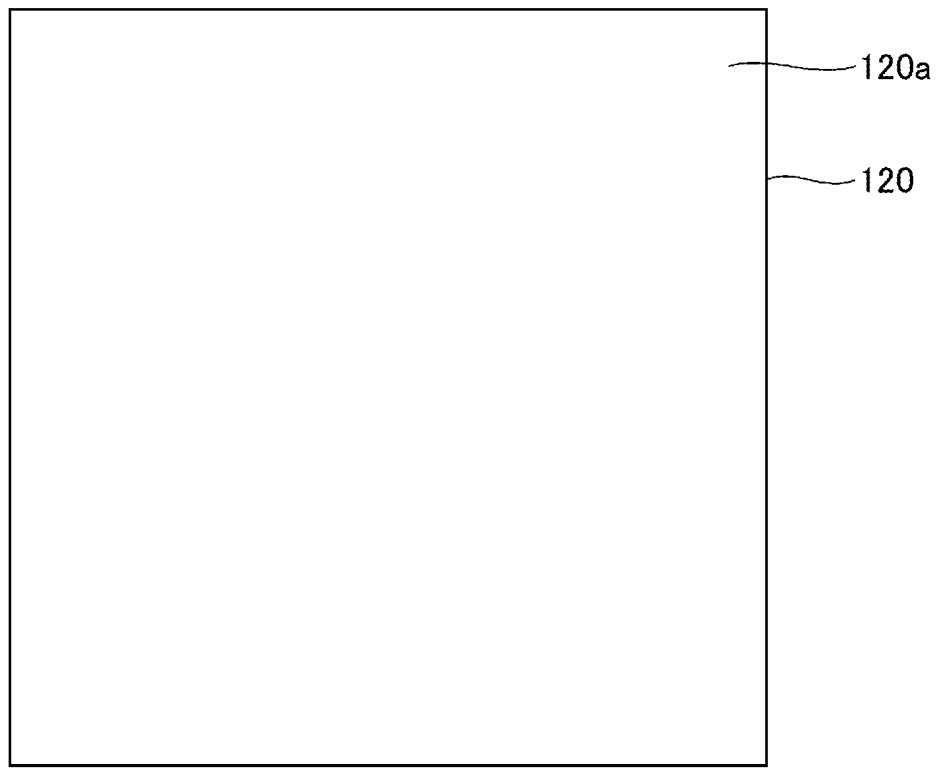
FIG. 7 is an explanatory drawing (1) of a process of manufacturing the silicon carbide semiconductor device according to the embodiment of the present disclosure.
Figure 7:
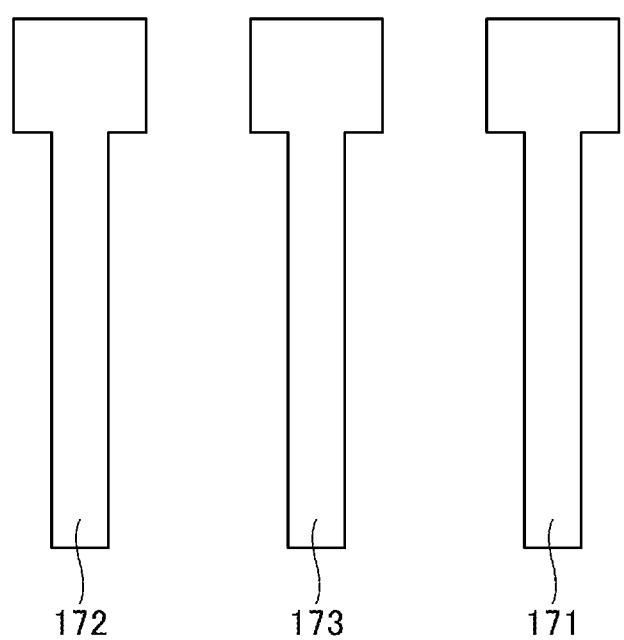
Figure 8:
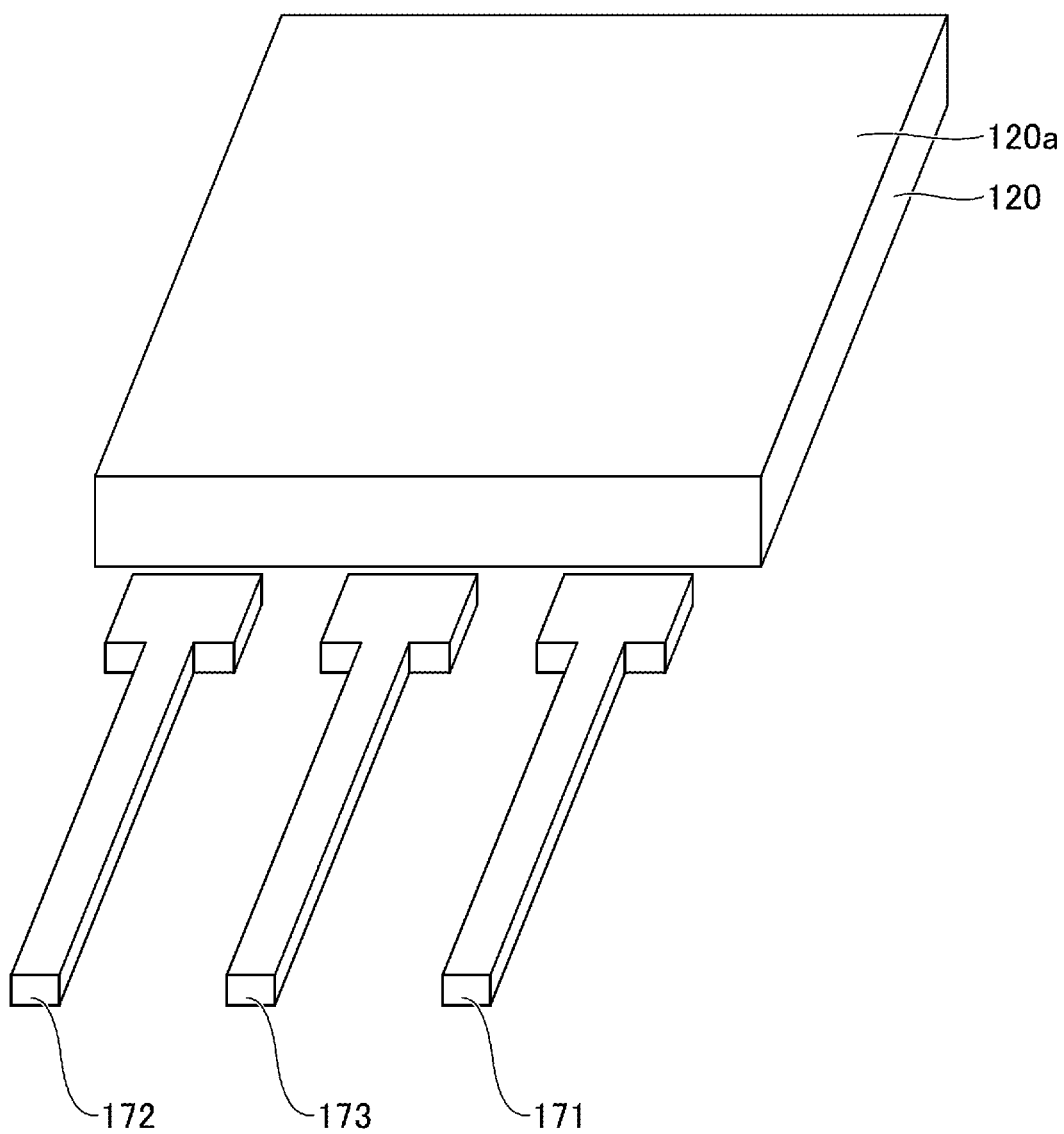
FIG. 8 is an explanatory drawing (2) of the process of manufacturing the silicon carbide semiconductor device according to the embodiment of the present disclosure.

First, as illustrated in FIG. 7 and FIG. 8, the metal plate 120 and lead frames, in which the gate electrode terminal 171, the source electrode terminal 172, and the drain electrode terminal 173 are formed, are prepared. The lead frame is formed by punching a metal plate formed of Cu or the like, and the metal plate 120, the gate electrode terminal 171, the source electrode terminal 172, and the drain electrode terminal 173 are connected to a frame of a lead frame (which is not illustrated). Because the frame of the lead frame is cut at the end of the process of manufacturing the semiconductor device, and no frame is left in the semiconductor device being manufactured, the present embodiment will be described by omitting the lead frame, for convenience. FIG. 7 is a top view of the metal plate 120, the gate electrode terminal 171, the source electrode terminal 172, and the drain electrode terminal 173, and FIG. 8 is a perspective view. The following description of the process will be made with reference to the perspective view.

Figure 9:
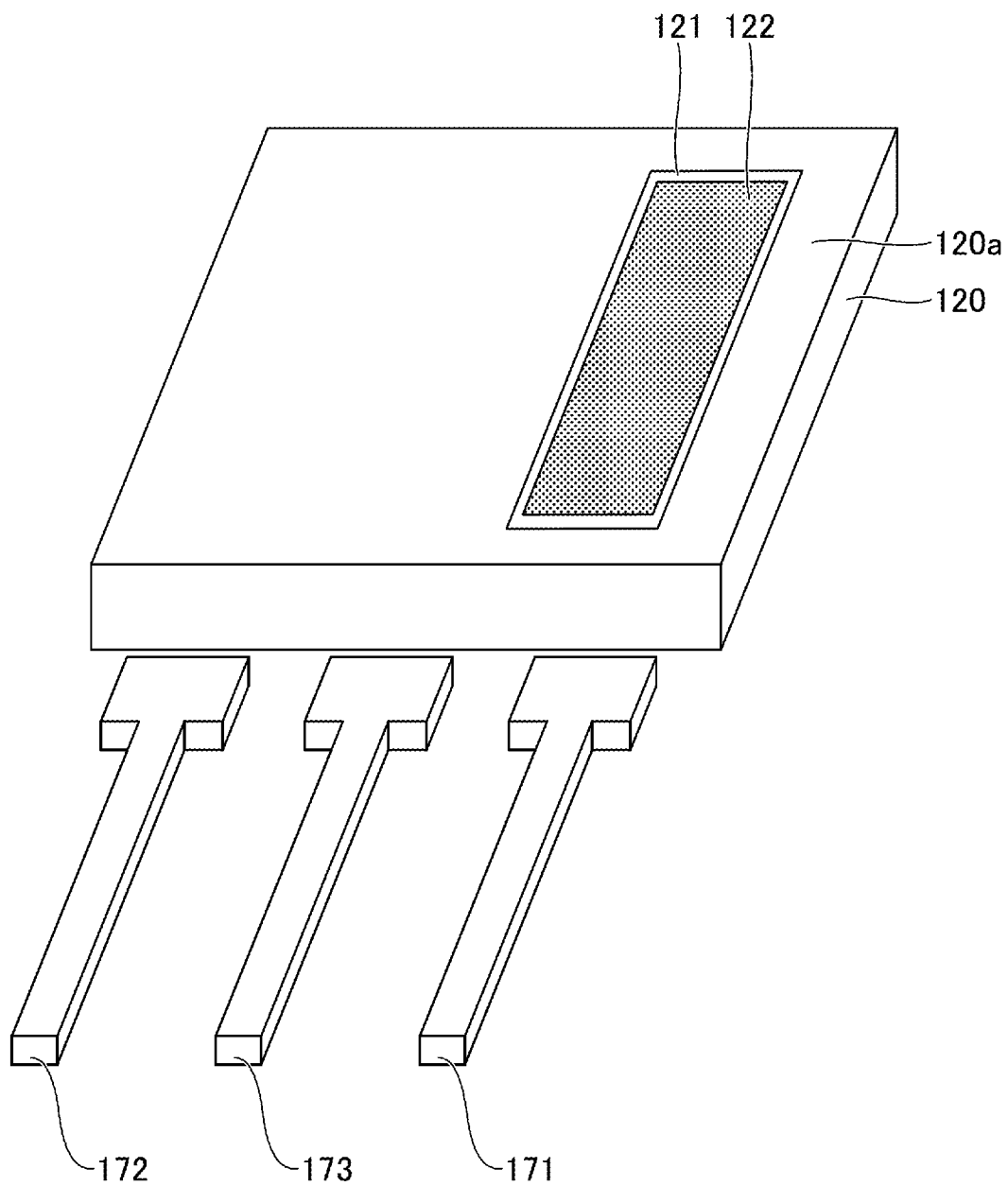
FIG. 9 is an explanatory drawing (3) of the process of manufacturing the silicon carbide semiconductor device according to the embodiment of the present disclosure.

Next, as illustrated in FIG. 9, the insulating film 121 is formed in an area of the first main surface 120a of the metal plate 120, including the area coupled to the gate electrode 11 of the silicon carbide semiconductor chip 10, and the first conductive layer 122 is further formed on the insulating film 121. The insulating film 121 is formed of polyimides having a film thickness of about 30 μm, and the first conductive layer 122 is formed of a Cu film having a film thickness of 5 μm to 20 μm.

Figure 10:
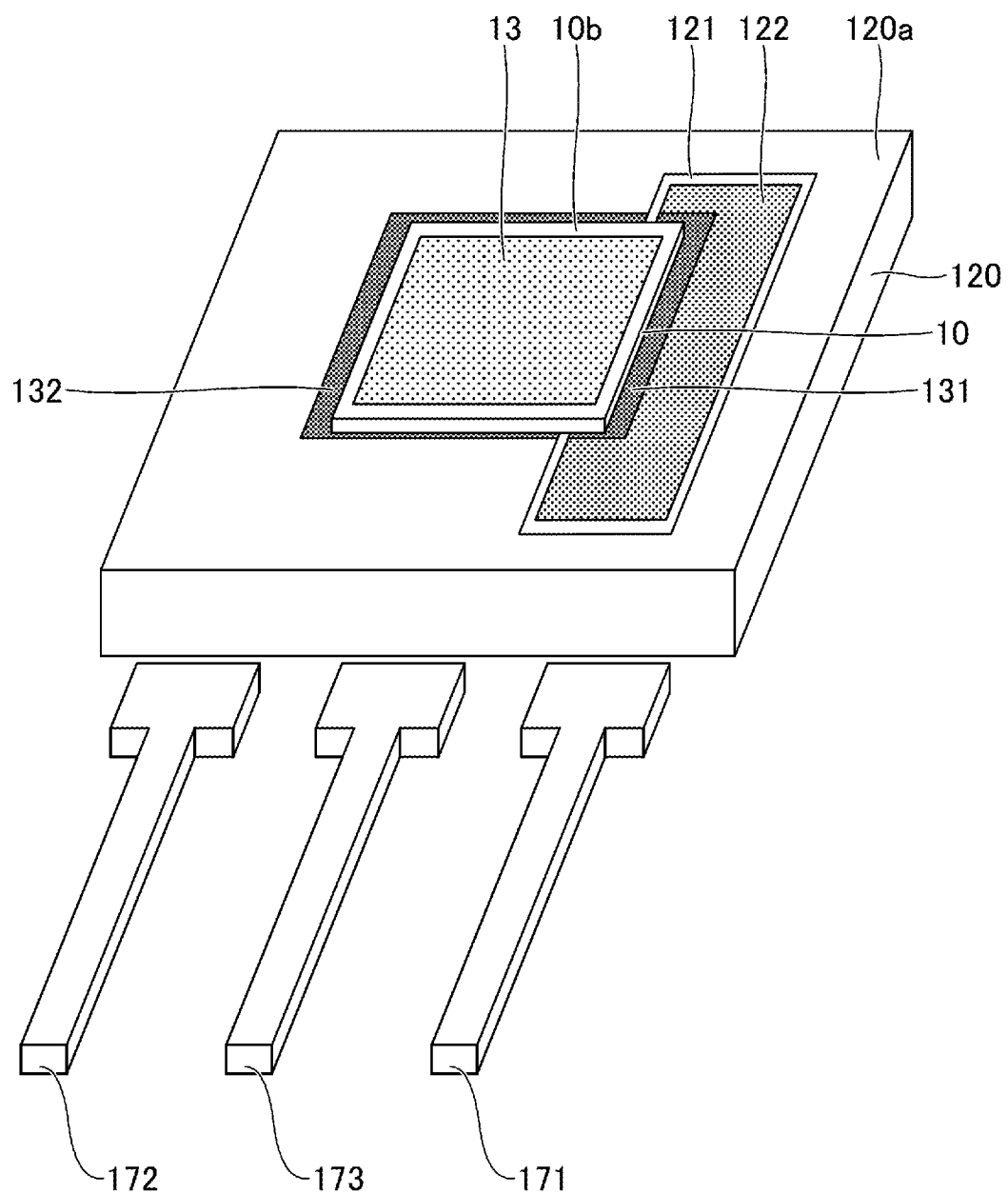
FIG. 10 is an explanatory drawing (4) of the process of manufacturing the silicon carbide semiconductor device according to the embodiment of the present disclosure.

Next, as illustrated in FIG. 10, the first main surface 120a of the metal plate 120 and the first surface 10a of the silicon carbide semiconductor chip 10 are arranged to face each other and bonded by the first bonding material 131 and the second bonding material 132. Specifically, the first conductive layer 122 formed on the first main surface 120a of the metal plate 120 and the gate electrode 11 of the first surface 10a of the silicon carbide semiconductor chip 10 are bonded by the first bonding material 131. At the same time, the first main surface 120a of the metal plate 120 and the source electrode 12 of the first surface 10a of the silicon carbide semiconductor chip 10 are bonded by the second bonding material 132.

Specifically, a bonding material that forms the first bonding material 131 and the second bonding material 132 is supplied to the first conductive layer 122 and the metal plate 120, the silicon carbide semiconductor chip 10 is placed on the bonding material, and the bonding material is heated and melted. This causes the molten bonding material to flow, causes the first bonding material 131 to be thinner than the second bonding material 132, and subsequently causes the first bonding material 131 and the second bonding material 132 to solidify. Here, the thickness of the first bonding material 131 and the second bonding material 132 is sufficiently thinner than the length of an area between the gate electrode 11 and the source electrode 12 where the insulating film 121 is exposed, and the bonding material in a molten state is repelled on the insulating film 121. Thus, the first bonding material 131 and the second bonding material 132 are famed separately.

Figure 11:
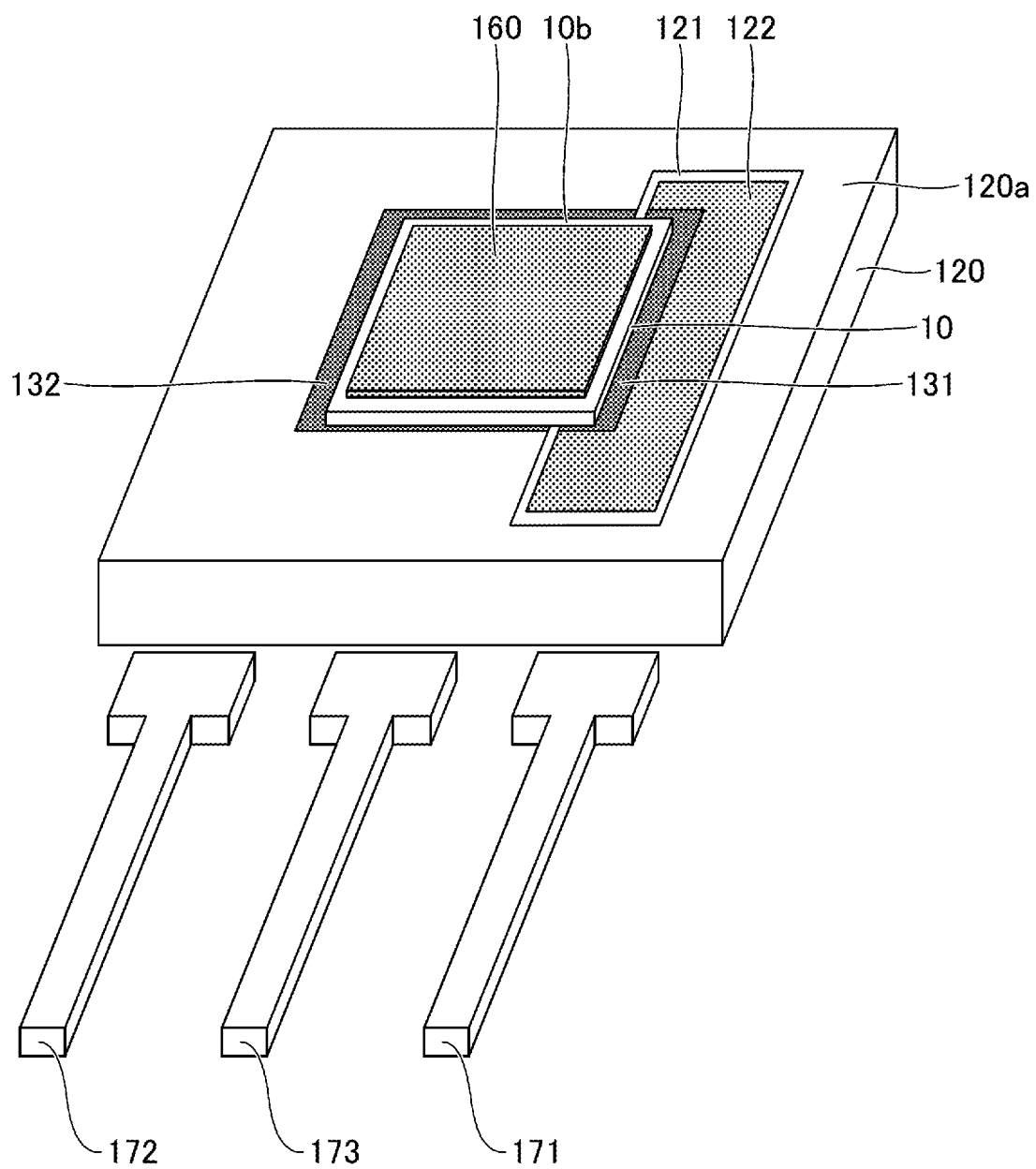
FIG. 11 is an explanatory drawing (5) of the process of manufacturing the silicon carbide semiconductor device according to the embodiment of the present disclosure.

Next, as illustrated in FIG. 11, the second conductive layer 160 is bonded to the drain electrode 13 on the second surface 10b of the silicon carbide semiconductor chip 10 with the third bonding material 133.

Figure 12:
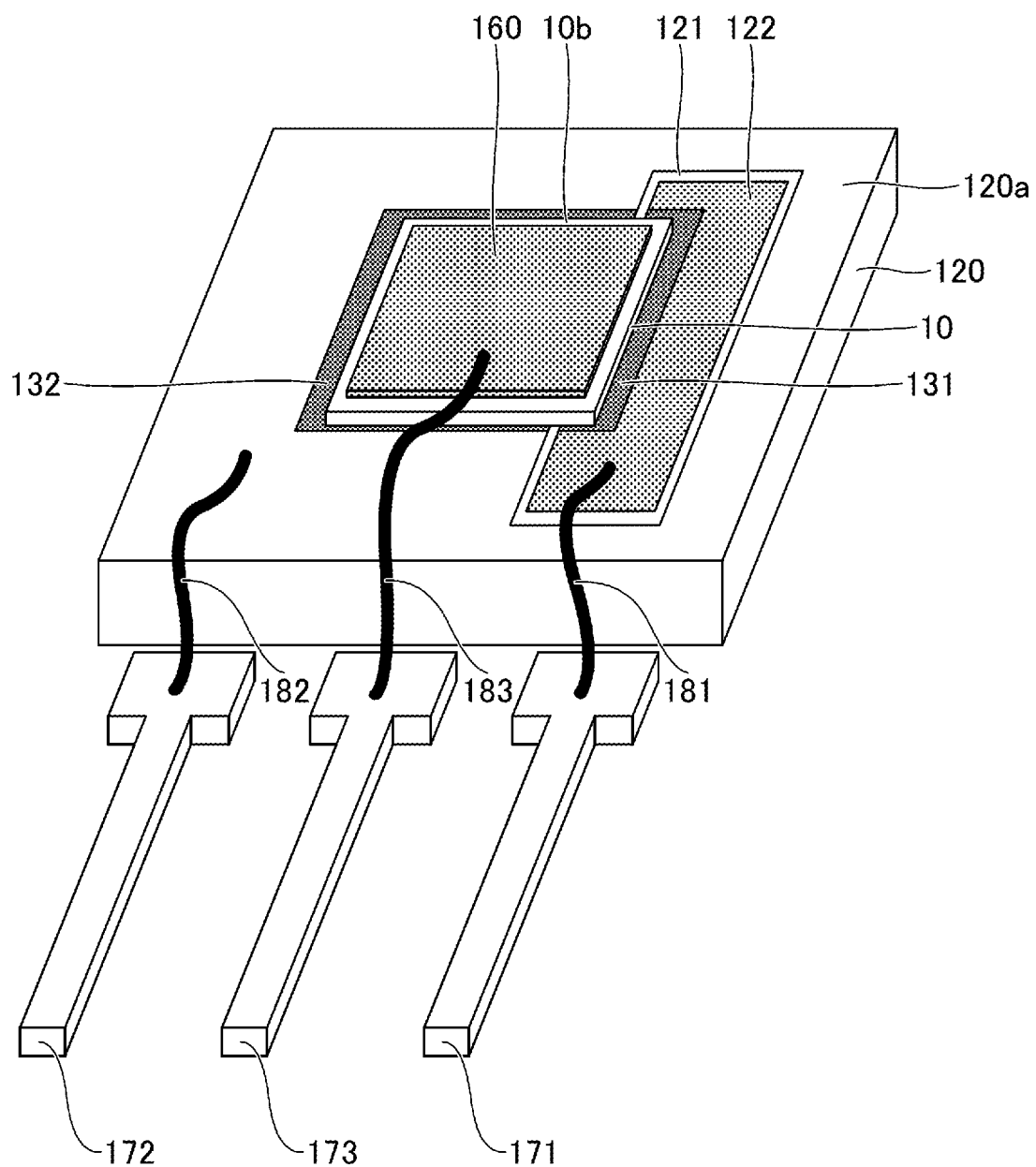
FIG. 12 is an explanatory drawing (6) of the process of manufacturing the silicon carbide semiconductor device according to the embodiment of the present disclosure.

Next, as illustrated in FIG. 12, the gate electrode terminal 171, the source electrode terminal 172, and the drain electrode terminal 173 are connected by wire bonding. Specifically, the first conductive layer 122 formed on the first main surface 120a of the metal plate 120 and the gate electrode terminal 171 are connected by the bonding wire 181. Because the gate electrode 11 of the silicon carbide semiconductor chip 10 is connected to the first conductive layer 122 by the first bonding material 131, the connection of the bonding wire 181 electrically couples the gate electrode 11 of the silicon carbide semiconductor chip 10 and the gate electrode terminal 171.

Similarly, the first main surface 120a of the metal plate 120 and the source electrode terminal 172 are connected by the bonding wire 182. Because the source electrode 12 of the silicon carbide semiconductor chip 10 is connected to the first main surface 120a of the metal plate 120 by the second bonding material 132, the connection of the bonding wire 182 electrically couples the source electrode 12 of the silicon carbide semiconductor chip 10 and the source electrode terminal 172.

Similarly, the second conductive layer 160 on the second surface 10b of the silicon carbide semiconductor chip 10 and the drain electrode terminal 173 are connected by the bonding wire 183. Because the drain electrode 13 of the silicon carbide semiconductor chip 10 is connected to the second conductive layer 160 by the third bonding material 133, the connection of the bonding wire 183 electrically couples the drain electrode 13 of the silicon carbide semiconductor chip 10 and the drain electrode terminal 173.

Figure 13:
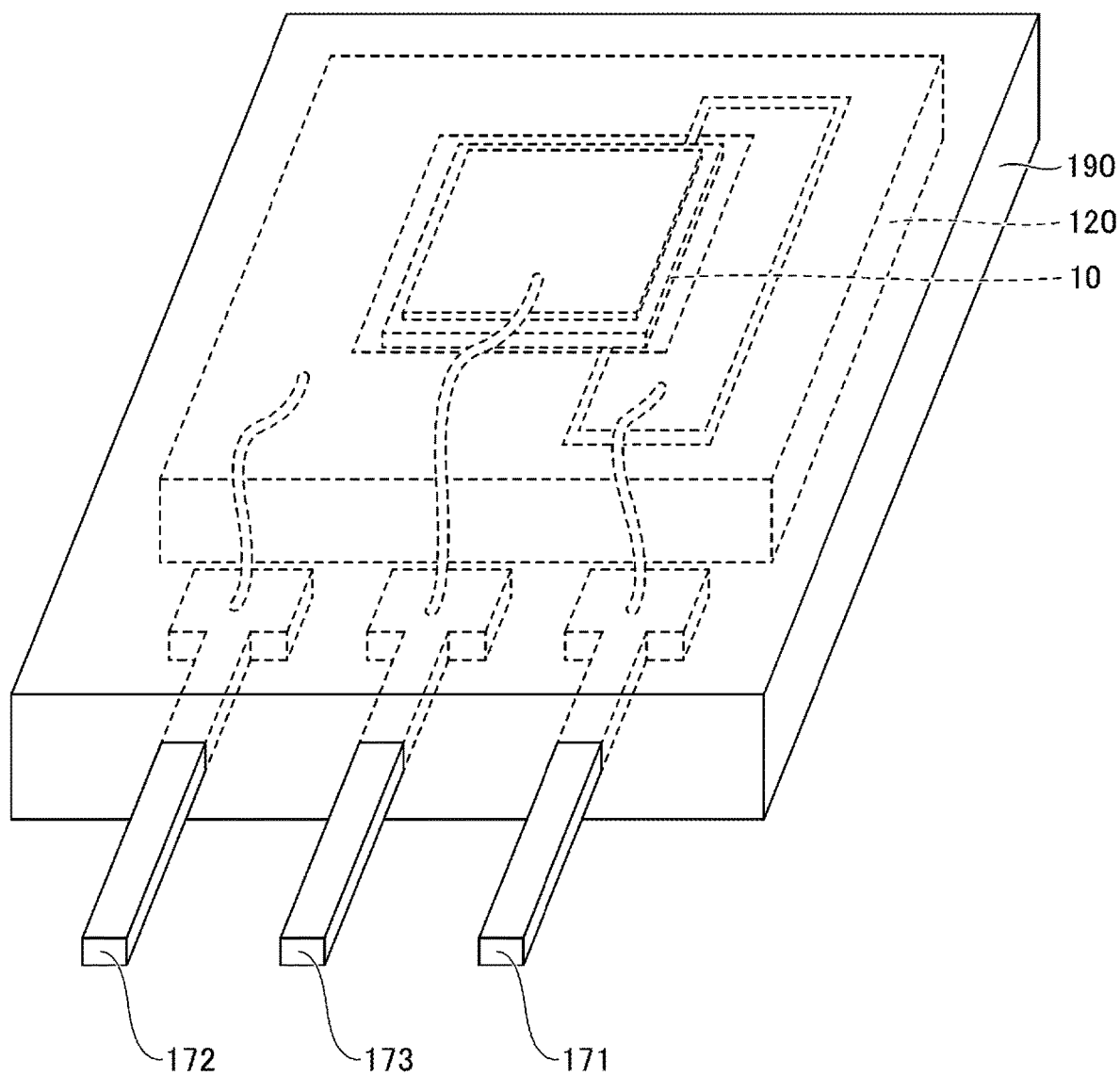
FIG. 13 is a perspective view (1) of the silicon carbide semiconductor device according to the embodiment of the present disclosure.
Figure 14:
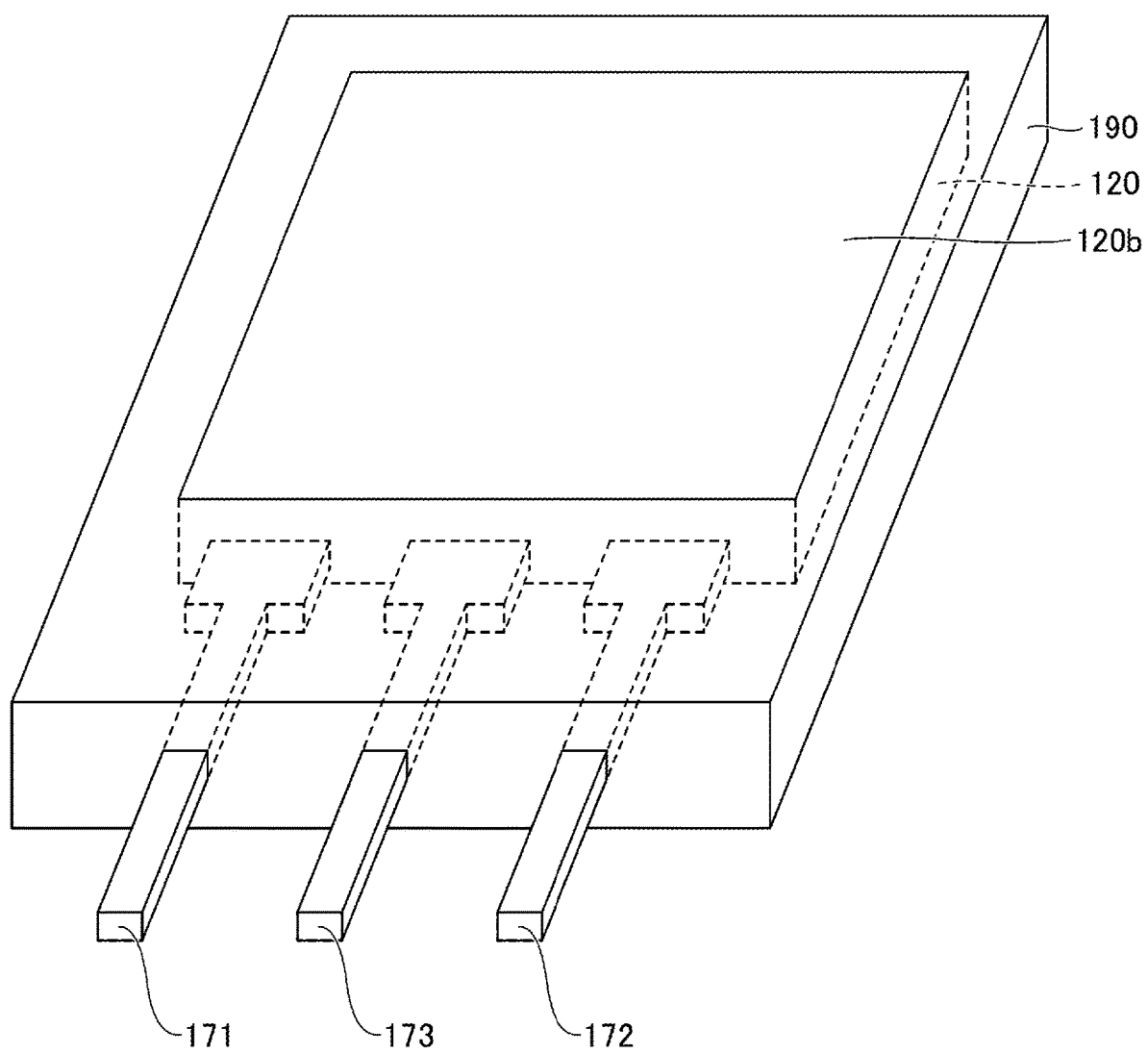
FIG. 14 is a perspective view (2) of the silicon carbide semiconductor device according to the embodiment of the present disclosure.

Next, as illustrated in FIG. 13 and FIG. 14, the first main surface 120a of the metal plate 120, the silicon carbide semiconductor chip 10, a portion of the gate electrode terminal 171, a portion of the source electrode terminal 172, and a portion of the drain electrode terminal 173 are molded by transfer molding and hardened by a mold resin 190. This causes the first main surface 120a of the metal plate 120, the silicon carbide semiconductor chip 10, the portion of the gate electrode terminal 171, the portion of the source electrode terminal 172, and the portion of the drain electrode terminal 173 to be covered by the mold resin 190. The second main surface 120b of the metal plate 120 is not covered by the mold resin 190 and is exposed. This is because the second main surface 120b of the metal plate 120 is caused to contact the heat sink (which is not illustrated) to dissipate heat. Here, FIG. 13 is a perspective view illustrating the metal plate 120 on the first main surface 120a side, and FIG. 14 is a perspective view illustrating the metal plate 120 on the second main surface 120b side.

The above-described process manufactures the silicon carbide semiconductor device according to the present embodiment.

(Simulation)

Next, a simulation performed to explain the effect of heat dissipation in the silicon carbide semiconductor device illustrated in FIG. 3 and the silicon carbide semiconductor device according to the present embodiment will be described. In the simulation, the thermal conductivity of the Sn—Cu solder serving as the bonding material is set to 63 W/m·K, the thermal conductivity of the metal plate 20 is set to 398 W/m·K, and the thermal conductivity of the insulating sheet 40 is set to 12 W/m·K. From these values, the thermal resistance between the silicon carbide semiconductor chip 10 and the heat sink 50 is calculated.

Table 1 shows the result obtained by performing a simulation using the silicon carbide semiconductor device having the structure illustrated in FIG. 3 as a model. The silicon carbide semiconductor chip 10 is substantially square with a side length of 6 mm. The Sn—Cu solder serving as the bonding material 31 is assumed to be in contact with the entire surface of the second surface 10b of the silicon carbide semiconductor chip 10, and is substantially square with a side length of 6 mm, and has a thickness of 0.1 mm. The metal plate 20 is substantially square with a side length of 12 mm and has a thickness of 1.5 mm, and the insulating sheet 40 is substantially square with a side length of 12 mm and has a thickness of 2.0 mm. As a result, the thermal resistance of the bonding material 31 is 0.044 K/W, the thermal resistance of the metal plate 20 is 0.026 K/W, and the thermal resistance of the insulating sheet 40 is 1.157 K/W. Therefore, the thermal resistance between the silicon carbide semiconductor chip 10 and the heat sink 50 is 1.228 K/W. The values of the thermal resistance of the bonding material 31, the metal plate 20, and the insulating sheet 40 are obtained by rounding to three decimal places. If the sum of the non-rounded thermal resistance values is rounded to three decimal places, 1.228 K/W is obtained.

TABLE 1

| | THERMAL CONDUCTIVITY (W/m · K) | LENGTH OF ONE SIDE (mm) | CONTACT AREA (m$^2$) | THICKNESS (mm) | THERMAL RESISTANCE (K/W) |
|---|---|---|---|---|---|
| SEMICONDUCTOR CHIP 10 | | 6 | | | |
| BONDING MATERIAL 31 (Sn—Cu SOLDER) | 63 | 6 | 0.000036 | 0.1 | 0.044 |
| METAL PLATE 20 | 398 | 12 | 0.000144 | 1.5 | 0.026 |
| INSULATING SHEET 40 | 12 | 12 | 0.000144 | 2.0 | 1.157 |
| TOTAL | | | | | 1.228 |

Table 2 shows the result obtained by performing a simulation using the silicon carbide semiconductor device according to the present embodiment illustrated in FIG. 6 as a model. The silicon carbide semiconductor chip 10 is substantially square with a side length of 6 mm. The Sn—Cu solder serving as the second bonding material 132 is assumed to be in contact with an area of ¾ of the second surface 10b of the silicon carbide semiconductor chip 10, and has a thickness of 0.1 mm. The metal plate 20 is substantially square with a side length of 12 mm and has a thickness of 1.5 mm. As a result, the thermal resistance of the second bonding material 132 is 0.059 K/W and the thermal resistance of the metal plate 20 is 0.026 K/W. Therefore, the thermal resistance between the silicon carbide semiconductor chip 10 and the heat sink 50 is 0.085 K/W. This value is about 7% of the thermal resistance in the silicon carbide semiconductor device having the structure illustrated in FIG. 3, and the thermal conductivity can be improved by a factor of about 14. Here, in the silicon carbide semiconductor device illustrated in FIG. 3, if a heat diffusion plate is used on the second main surface 20b of the metal plate 20 to dissipate heat equally, a heat diffusion plate having an area about 50 times greater than the area of the metal plate 20 is required, and the size of the semiconductor device is increased.

TABLE 2

| | THERMAL CONDUCTIVITY (W/m·K) | LENGTH OF ONE SIDE (mm) | CONTACT AREA ($m^2$) | THICKNESS (mm) | THERMAL RESISTANCE (K/W) |
|---|---|---|---|---|---|
| SEMICONDUCTOR CHIP 10 | | 6 | | | |
| BONDING MATERIAL 132 (Sn—Cu SOLDER) | 63 | 6 | 0.000027 | 0.1 | 0.059 |
| METAL PLATE 20 | 398 | 12 | 0.000144 | 1.5 | 0.026 |
| TOTAL | | | | | 0.085 |

Table 3 shows the result obtained by performing a simulation using the silicon carbide semiconductor device according to the present embodiment illustrated in FIG. 6 as a model, where a Cu sintered bond is used for the second bonding material 132. The condition is the same as the condition in Table 2 except that, for the Cu sintered bonding material serving as the bonding material, the thermal conductivity is 300 W/m·K and the thickness is 0.05 mm. As a result, the thermal resistance of the second bonding material 132 is 0.006 K/W and the thermal resistance of the metal plate 20 is 0.026 K/W. Therefore, the thermal resistance between the silicon carbide semiconductor chip 10 and the heat sink 50 is 0.032 K/W. This value is about 2.6% of the thermal resistance in the silicon carbide semiconductor device having the structure illustrated in FIG. 3, and the thermal conductivity can be improved by a factor of about 38.

TABLE 3

| | THERMAL CONDUCTIVITY (W/m·K) | LENGTH OF ONE SIDE (mm) | CONTACT AREA ($m^2$) | THICKNESS (mm) | THERMAL RESISTANCE (K/W) |
|---|---|---|---|---|---|
| SEMICONDUCTOR CHIP 10 | | 6 | | | |
| BONDING MATERIAL 132 (SINTERING Cu BONDING MATERIAL) | 300 | 6 | 0.000027 | 0.05 | 0.006 |
| METAL PLATE 20 | 398 | 12 | 0.000144 | 1.5 | 0.026 |
| TOTAL | | | | | 0.032 |

As described above, the silicon carbide semiconductor chip 10 is a MOSFET, in which the gate electrode 11, the source electrode 12, and the drain electrode 13 are formed. However, the silicon carbide semiconductor chip 10 may be another type of a transistor famed of SiC. For example, in a case of an insulated gate bipolar transistor (IGBT), the first electrode of the silicon carbide semiconductor chip 10 is a gate electrode, the second electrode is an emitter electrode, and the third electrode is a collector electrode. Additionally, the gate electrode terminal 171 is a gate electrode terminal, the source electrode terminal 172 is an emitter electrode terminal, and the drain electrode terminal 173 is a collector electrode terminal.

Although the embodiment has been described above in detail, the embodiment is not limited to a specific embodiment, and various modifications and changes can be made within the scope described in claims.

DESCRIPTION OF THE REFERENCE NUMERALS 10 silicon carbide semiconductor chip
10a first surface
10b second surface
11 gate electrode (first electrode)
12 source electrode (second electrode)
13 drain electrode (third electrode)
20 metal plate
20a first main surface
20b second main surface
31 bonding material
40 insulating sheet
50 heat sink
120 metal plate
120a first main surface
120b second main surface
121 insulating film
122 first conducting layer
131 first bonding material
132 second bonding material
133 third bonding material
160 second conducting layer
171 gate electrode terminal
172 source electrode terminal
173 drain electrode terminal
181 bonding wire
182 bonding wire
183 bonding wire
190 mold resin

The invention claimed is:

1. A silicon carbide semiconductor device comprising:
a metal plate having a first main surface and a second main surface, the second main surface being opposite to the first main surface;
an insulating film provided on a portion of the first main surface of the metal plate;
a first conductive layer provided on the insulating film; and
a silicon carbide semiconductor chip that includes a first electrode and a second electrode on a first surface and a third electrode on a second surface, the second surface being opposite to the first surface;
wherein the first surface of the silicon carbide semiconductor chip faces the first main surface of the metal plate, the first electrode is bonded to the first conductive layer with a first bonding material, and the second electrode is bonded to the first main surface of the metal plate with a second bonding material.

2. The silicon carbide semiconductor device as claimed in claim 1, further comprising a second conductive layer bonded on the third electrode of the silicon carbide semiconductor chip with a third bonding material.

3. The silicon carbide semiconductor device as claimed in claim 1,
wherein the first electrode is a gate electrode, the second electrode is a source electrode, and the third electrode is a drain electrode, and
wherein the gate electrode is connected to a gate electrode terminal by a bonding wire, the source electrode is connected to a source electrode terminal by a bonding wire, and the drain electrode is connected to a drain electrode terminal by a bonding wire.

4. The silicon carbide semiconductor device as claimed in claim 1,
wherein the first electrode is a gate electrode, the second electrode is an emitter electrode, and the third electrode is a collector electrode, and
wherein the gate electrode is connected to a gate electrode terminal by a bonding wire, the emitter electrode is connected to an emitter electrode terminal by a bonding wire, and the collector electrode is connected to a collector electrode terminal by a bonding wire.

5. The silicon carbide semiconductor device as claimed in claim 2,
wherein the first electrode is a gate electrode, the second electrode is a source electrode, and the third electrode is a drain electrode, and
wherein the gate electrode is connected to a gate electrode terminal by a bonding wire, the source electrode is connected to a source electrode terminal by a bonding wire, and the second conductive layer is connected to a drain electrode terminal by a bonding wire.

6. The silicon carbide semiconductor device as claimed in claim 2,
wherein the first electrode is a gate electrode, the second electrode is an emitter electrode, and the third electrode is a collector electrode, and
wherein the gate electrode is connected to a gate electrode terminal by a bonding wire, the emitter electrode is connected to an emitter electrode terminal by a bonding wire, and the second conductive layer is connected to a collector electrode terminal by a bonding wire.

7. The silicon carbide semiconductor device as claimed claim 1, wherein a thermal conductivity of the metal plate is 10 W/m·K or greater, a linear expansion coefficient of the metal plate is 17.0 ppm/K or less, and a volume resistivity of the metal plate is 1 µΩ·m or less.

8. The silicon carbide semiconductor device as claimed in claim 1, wherein a film thickness of the insulating film is 10 µm or greater and 40 µm or less.

9. The silicon carbide semiconductor device as claimed in claim 1, wherein a film thickness of the first conductive layer is 5 µm or greater and 20 µm or less.

10. The silicon carbide semiconductor device as claimed in claim 1, wherein the first bonding material and the second bonding material contain copper or silver.

11. The silicon carbide semiconductor device as claimed in claim 1, wherein a heat sink is connected to the second main surface of the metal plate.

12. A silicon carbide semiconductor device comprising:
a metal plate having a first main surface and a second main surface, the second main surface being opposite to the first main surface;

an insulating film provided on a portion of the first main surface of the metal plate;
a first conductive layer provided on the insulating film;
a silicon carbide semiconductor chip that includes a first electrode and a second electrode on a first surface and a third electrode on a second surface, the second surface being opposite to the first surface; and
a second conductive layer bonded on the third electrode of the silicon carbide semiconductor chip with a third bonding material,
wherein the first surface of the silicon carbide semiconductor chip faces the first main surface of the metal plate, the first electrode is bonded to the first conductive layer with a first bonding material, and the second electrode is bonded to the first main surface of the metal plate with a second bonding material,
wherein a thermal conductivity of the metal plate is 10 W/m·K or greater, a linear expansion coefficient of the metal plate is 17.0 ppm/K or less, and a volume resistivity of the metal plate is 1 µΩ·m or less,
wherein a film thickness of the insulating film is 10 µm or greater and 40 µm or less,
wherein a film thickness of the first conductive layer is 5 µm or greater and 20 µm or less, and
wherein the first bonding material and the second bonding material contain copper or silver.

* * * * *